(12) United States Patent
Berner

(10) Patent No.: US 10,648,432 B2
(45) Date of Patent: May 12, 2020

(54) DEVICE FOR ATTACHING A CONTROL UNIT TO AN INTERNAL COMBUSTION ENGINE

(71) Applicant: MAN Truck & Bus AG, München (DE)

(72) Inventor: Armin Berner, Herrieden (DE)

(73) Assignee: MAN TRUCK & BUS AG, München (DE)

( * ) Notice: Subject to any disclaimer, the term of this patent is extended or adjusted under 35 U.S.C. 154(b) by 35 days.

(21) Appl. No.: 15/881,385

(22) Filed: Jan. 26, 2018

(65) Prior Publication Data
US 2018/0209385 A1    Jul. 26, 2018

(30) Foreign Application Priority Data
Jan. 26, 2017   (DE) .................... 10 2017 000 699

(51) Int. Cl.
*F02M 35/10*        (2006.01)

(52) U.S. Cl.
CPC .. *F02M 35/10249* (2013.01); *F02M 35/1038* (2013.01); *F02M 35/10144* (2013.01); *F02M 35/10386* (2013.01); *F02M 35/10098* (2013.01)

(58) Field of Classification Search
CPC ........ F02F 1/40; F02F 1/14; F02F 1/10; F16J 15/0818; F02B 75/045; F02D 15/02
See application file for complete search history.

(56) References Cited

U.S. PATENT DOCUMENTS

| 7,729,117 | B2 | 6/2010 | Schweinbenz et al. |
| 2002/0104490 | A1 | 8/2002 | Itakura et al. |
| 2007/0243775 | A1 | 10/2007 | Osakabe et al. |
| 2010/0154758 | A1* | 6/2010 | Schneider ................. G01F 1/44 |
| | | | 123/568.12 |
| 2014/0244110 | A1* | 8/2014 | Tharaldson ............ G07C 5/008 |
| | | | 701/36 |

(Continued)

FOREIGN PATENT DOCUMENTS

| CN | 205297690 U | 6/2016 |
| DE | 10104568 A1 | 8/2001 |

(Continued)

OTHER PUBLICATIONS

PA Polyamide, 2019, Ensinger, https://www.ensingerplastics.com/en-us/shapes/engineering-plastics/pa-polyamide, p. 1.*

(Continued)

*Primary Examiner* — Jacob M Amick
*Assistant Examiner* — Charles Brauch
(74) *Attorney, Agent, or Firm* — Weber Rosselli Cannon LLP

(57) ABSTRACT

The present disclosure relates to a device for attaching a control unit, preferentially an electronic engine control unit, to a component of an internal combustion engine. The device includes a first connecting component which is designed in order to be attached to the component of the internal combustion engine the first connecting component comprising a first fluid duct. The device further includes a second connecting component, which, via at least one damping element, is attached, spaced from the first fluid duct, to the first connecting component and is designed for mounting the control unit.

17 Claims, 5 Drawing Sheets

(56) References Cited

U.S. PATENT DOCUMENTS

2016/0032877 A1  2/2016  Kuki

FOREIGN PATENT DOCUMENTS

| | | | | |
|---|---|---|---|---|
| DE | 10303763 | A1 | 10/2003 | |
| DE | 10317705 | A1 | 10/2004 | |
| DE | 102010063155 | A1 | 6/2012 | |
| DE | 102016212738 | A1 | 1/2017 | |
| EP | 0968885 | A2 | 1/2000 | |
| EP | 1057674 | A1 | 12/2000 | |
| EP | 1422405 | A2 * | 5/2004 | ............ F02D 9/105 |
| EP | 1422405 | A2 | 5/2004 | |
| WO | 2005/031133 | A1 | 4/2005 | |
| WO | WO-2005031133 | A1 * | 4/2005 | ............ F02B 29/083 |

OTHER PUBLICATIONS

Extended European Search Report issued in corresponding EP application No. 18151687.3 dated Apr. 4, 2018, 2 pages.
German Search Report issued in corresponding application No. 102017000699.7 dated Oct. 16, 2017, 1 page.
European Office Action issued in corresponding European Patent Application No. 18151687.3 dated Jan. 31, 2020, 3 pages. No English translation available.

\* cited by examiner

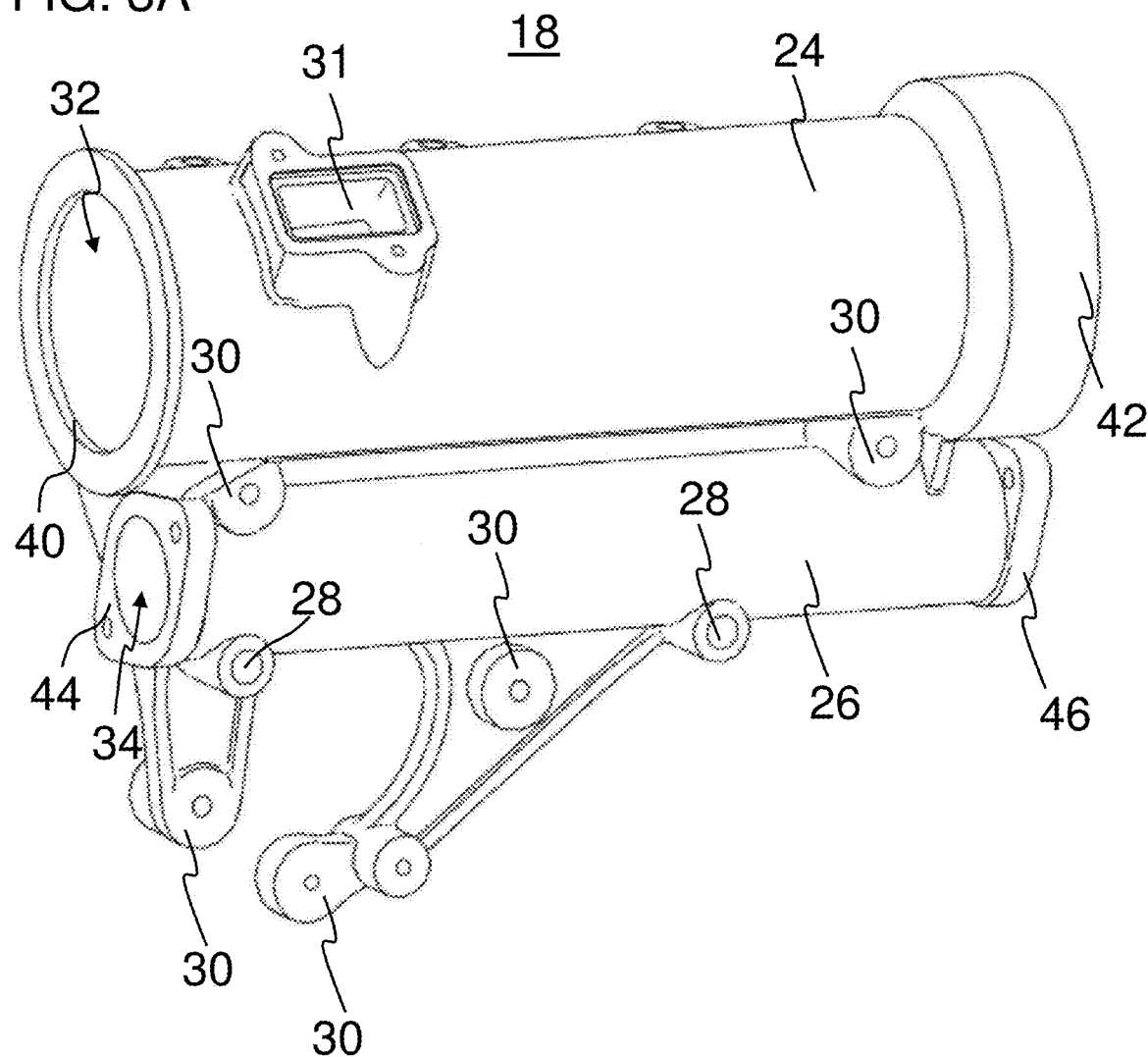

DEVICE FOR ATTACHING A CONTROL UNIT TO AN INTERNAL COMBUSTION ENGINE

FIELD OF THE DISCLOSURE

The present disclosure relates to a device for attaching a control unit to a component of an internal combustion engine. The present disclosure furthermore relates to an internal combustion engine having a device for attaching a control unit to a component of the internal combustion engine. In addition, the present disclosure relates to a motor vehicle, in particular a utility vehicle, with an internal combustion engine or a device for attaching a control unit to a component of an internal combustion engine.

BACKGROUND

Engine control units or control units can be attached to the outside of a component of an internal combustion engine, for example to a crankcase. Because of vibrations, the control units are frequently attached to the internal combustion engine connecting damping elements of elastic materials in between. The damping elements dampen the vibrations originating from the internal combustion engine so that the control unit withstands the use on the internal combustion engine over the lifespan of the internal combustion engine.

In the case of structures in which the control unit is attached to the internal combustion engine on the outside, the attachment is frequently effected by means of two brackets or connecting components. The first connecting component is connected fixed to the internal combustion engine. The second connecting component is connected fixed to the control unit. The damping elements are located between the two brackets.

Other known structures include a control unit directly integrated in an intake air system of an internal combustion engine so that the control unit can be cooled by the intake air. Such systems are disclosed for example in DE 101 04 568 A1, US 2002/104490 A1 and DE 103 03 763 A. While these solutions can be effective, improvements are always desirable.

SUMMARY

Based on a structure in which a control unit, dampened via a connecting component, is attached to a component of the internal combustion engine on the outside, it is an object of the present disclosure to expand the connecting component so that it fulfils additional functions.

This object is solved through a device for attaching a control unit having the features of the independent claim. Advantageous embodiments and applications of the present disclosure are obtained from the dependent claims.

The device for attaching a control unit, for example, an electronic engine control unit, to a component of an internal combustion engine comprises a first or engine-side connecting component and a second or control unit-side connecting component. The first connecting component is designed in order to be attached or fastened to the component of the internal combustion engine. The first connecting component comprises a first fluid duct. The second connecting component, via at least one damping element, is attached to the first connecting component. The second connecting component is arranged spaced from the first fluid duct. The second connecting component is designed for the mounting of the control unit.

Providing a first fluid duct in the first connecting component according to the present disclosure makes it possible for the first connecting component to fulfil a plurality of functions. On the one hand, the first connecting component continues to serve for attaching a control unit to a component of the internal combustion engine, for example a cylinder head, a cylinder head cover or a crankcase. The control unit is attached to the first connecting component in a dampened manner in particular via a second connecting component and at least one damping element. The second connecting component is attached to the first connecting component on the outside via the damping element or damping elements. In addition to the attachment of the control unit, the first connecting component has a further function. The first connecting component can be used in order to conduct a fluid necessary for the operation of the internal combustion engine in the first fluid duct. This can be for example charge air, exhaust gas, hydraulic fluid, coolant, fuel, compressed air or lubricant. Consequently, the first connecting component can be integrated for example in a charge air system of the internal combustion engine. The first fluid duct can for example form a section of an intake air line or an exhaust gas recirculation line of the charge air system.

The first connecting component and/or the second connecting component can be provided in particular as brackets. The first connecting component can be connected fixed to the component of the internal combustion engine. The second connecting component can be connected fixed to the control unit. The second connecting component, dampened via the at least one damping element, is connected to the first connecting component so that the control unit is connected to the component of the internal combustion engine in a dampened manner. The control unit and the second connecting component can be arranged outside of the first fluid duct. The damping element or decoupling element can be an elastic body, for example a rubber element, which for example comprises a through-hole for fastening the rubber element by means of a screw, a bolt etc. The damping element dampens the vibrations between the first connecting component and the second connecting component so that the vibrations are transmitted from the internal combustion engine to the control unit in a dampened manner. A plurality of damping elements spaced from one another can be used which are fastened for example in positions with vibration maximums of the first connecting component.

According to an embodiment, the first connecting component comprises a second fluid duct. The second fluid duct can be provided in particular separately from the first fluid duct and/or run substantially parallel to the first fluid duct. Accordingly, the first connecting component can conduct a second medium in the second fluid duct.

At least one fastening region may be arranged between a first fluid duct (the first pipe section with the first fluid duct) and a second fluid duct (the second pipe section with the second fluid duct). The at least one fastening region is designed for fastening one of the at least one damping element. Alternatively or additionally, the at least one fastening region is designed for mounting the first connecting component to the component of the internal combustion engine. Consequently, the positioning of the fastening regions can be improved with a view to an easy access for mounting. A positioning between the fluid ducts can, furthermore, improve the damping in that damping elements, if desired, can be positioned more closely to positions with vibration maximums. In addition it is made possible that the duct courses of the fluid ducts are not negatively influenced.

In an exemplary embodiment, a first pipe section with the first fluid duct and a second pipe section with the second fluid duct are connected to one another by at least one stiffening rib. This makes it possible to increase the stiffness of the first connecting component.

In accordance with a further embodiment the first connecting component includes at least one fastening region for fastening the at least one damping element, a first pipe section with the first fluid duct and/or a second pipe section with the second fluid duct. The first pipe section, the second pipe section and/or the at least one fastening region are formed integrally with one another (produced or manufactured from one piece). Thus, the number of parts can be reduced relative to a conventional design, in which a connecting component and one or two pipe sections with fluid duct are provided separately from one another. This makes possible a structure that is favourable in terms of mounting and weight.

Alternatively or additionally, the first connecting component can be a casting. The additional functions (e.g. media conduction in flow ducts and accommodating sensors) of the first connecting component can thus be realized on the first connecting component with little additional expenditure for the structure. The first connecting component produced by casting can be reworked for example by means of a machining method for comprising the additional function(s).

According to a further embodiment, the first connecting component furthermore comprises at least one sensor mounting for receiving a sensor. This makes it possible for the first connecting component to assume a further additional function. The first connecting component additionally serves as a holder for a sensor. The at least one sensor mounting can lead in particular into the first fluid duct and/or the second fluid duct. Consequently, measurements concerning a fluid flowing through the first or second fluid duct can be carried out by a sensor positioned in the sensor mounting.

Advantageously, the first fluid duct and/or the second fluid duct comprise(s) a venturi pipe section (venturi nozzle section) and the at least one sensor mounting leads in particular into the venturi pipe section. A venturi pipe is characterized by a constriction of a flow cross section of a duct. Consequently, the internal geometry of the first fluid duct and/or of the second fluid duct can be adapted to the measurement principle of a sensor in the sensor mounting. Expressed in other words, the internal geometry of the first fluid duct comprising a venturi pipe section can make possible the measurement according to the measurement principle of the sensor used in the first place.

In some embodiments, the device can furthermore include at least one sensor which is received in the at least one sensor mounting. The sensor can for example be a pressure sensor, a temperature sensor or a flow rate sensor. The sensor can be provided in the sensor mounting so that it is functionally connected to the first fluid duct and/or the second fluid duct. For example, the sensor can at least partly project into the fluid duct for measuring a fluid pressure, a fluid flow rate and/or a fluid temperature.

Furthermore, a flow rate changing device is may be attached to the device. The flow rate changing device can for example be a throttle valve or a valve. The flow rate changing device can be provided at an inlet of the first fluid duct, at an inlet of the second fluid duct, in the first fluid duct, in the second fluid duct, at an outlet of the first fluid duct and/or at an outlet of the second fluid duct. Accordingly, a further function, namely the possibility of changing a flow rate through the first fluid duct and/or the second fluid duct, is integrated in the first connecting component.

Further components can be installed in or attached to the inlet, in the first fluid duct and/or to the outlet of the first fluid duct and/or of the second fluid duct. These components comprise for example filters, baffle plates, pipelines, etc.

In a further exemplary embodiment, the first fluid duct and/or the second fluid duct comprise(s) an inlet or a plurality of inlets for uniting a plurality of part flows and an outlet or a plurality of outlets for branching into a plurality of part flows. This makes possible a flexible adaptation to the line system into which the first fluid duct and/or the second fluid duct of the first connecting component is to be integrated.

Alternatively or additionally, the first fluid duct and/or the second fluid duct can be embodied in multiple passages, i.e. comprise a plurality of (part) flow passages.

The at least one damping element comprises a plurality of damping elements which are arranged in positions of the first connecting component spaced from one another. In the installed state of the first connecting component, i.e. in the state mounted to the component of the internal combustion engine, the plurality of damping elements are spaced from one another in particular in a vertical direction and/or in a horizontal direction.

In addition, the present disclosure relates to an internal combustion engine for a motor vehicle, in particular a utility vehicle. The internal combustion engine comprises the device for attaching a control unit as disclosed herein. The first fluid duct and/or the second fluid duct of the first connecting component form(s) a section of an intake airline of the internal combustion engine, a section of an exhaust line of the internal combustion engine, a section of an exhaust gas recirculation line of the internal combustion engine, a section of a compressed-air line of the internal combustion engine, a section of a hydraulic line of the internal combustion engine, a section of an oil line of the internal combustion engine, a section of a fuel line of the internal combustion engine or a section of a coolant line of the internal combustion engine.

The component, to which the first connecting component is mounted, is in particular a crankcase, a cylinder head and/or a cylinder head cover.

The present disclosure furthermore relates to a motor vehicle, in particular a utility vehicle, having a device for attaching a control unit to a component of an internal combustion engine as disclosed herein or an internal combustion engine as disclosed herein.

According to a further aspect of the invention, a (first or engine-side) connecting component of a device for attaching a control unit can be provided on a component of an internal combustion engine. The connecting component is designed for being attached to the components of the internal combustion engine. The connecting component comprises at least one fluid duct, in particular a first fluid duct and a second fluid duct. The first fluid duct can extend through a first pipe section and the second fluid duct can extend through a second pipe section. The connecting component furthermore comprises a fastening region which is designed for fastening at least one damping element for attaching a further connecting component for mounting the control unit to the connecting component. The further connecting component, the at least one damping element and/or the fastening region are arranged spaced from the first fluid duct and/or the second fluid duct. The first pipe section, the second pipe section and/or the fastening region can be formed in particular integrally with one another, for example as a casting. The connecting component can be designed like the first connecting component disclosed herein.

BRIEF DESCRIPTION OF THE FIGURES

The previously described embodiments and features of the present disclosure can be combined with one another as desired. Further details and advantages of the present disclosure are described in the following making reference to that attached drawings, in which:

FIG. 3A shows a perspective front view of a first connecting component of the device for attaching the control unit;

DETAILED DESCRIPTION

Figure 1:
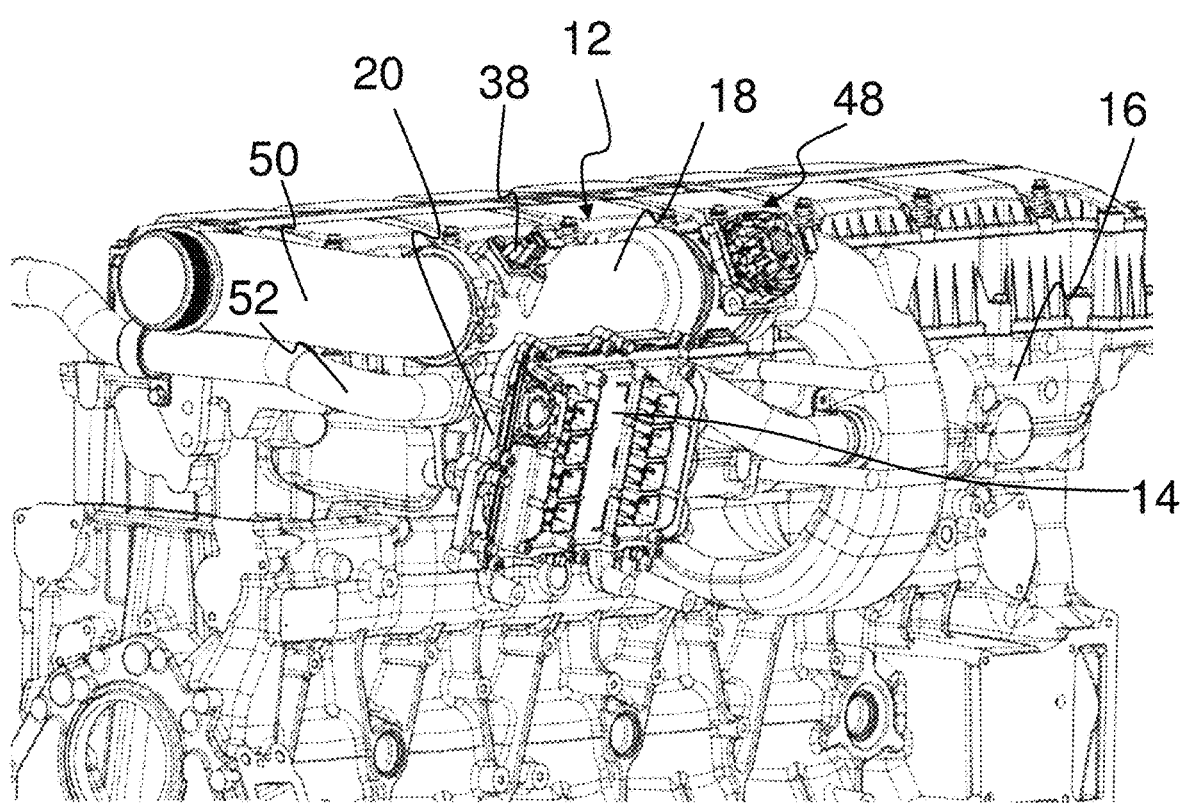
FIG. 1 shows a perspective view of an internal combustion engine with a device for attaching a control unit.

FIG. 1 shows a region of an internal combustion engine 10. The internal combustion engine 10 comprises a device 12 for attaching a control unit (electronic engine control unit) 14 to a component 16 of the internal combustion engine 10. In the shown exemplary embodiment, the component 16 is a cylinder head. In other embodiments, the component 16 can for example be a crankcase or a cylinder head cover.

Figure 2:
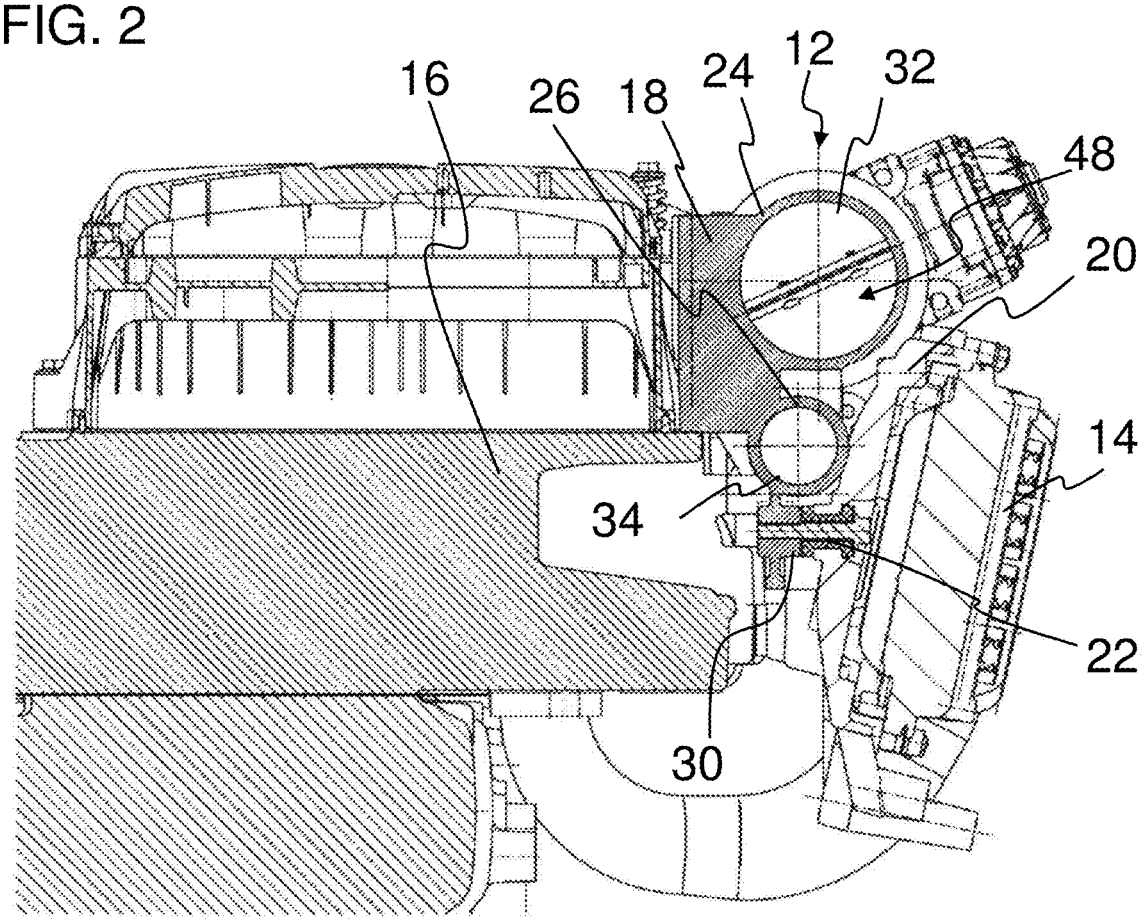
FIG. 2 shows a sectional view through a region of the internal combustion engine and the device for attaching the control unit.

The device 12 for attaching the control unit 14 comprises a first connecting component 18, a second connecting component 20 and a plurality of damping elements or decoupling elements 22 (see FIG. 2; concealed in FIG. 1).

As is evident from FIG. 2, the damping elements 22 are arranged between the first connecting component 18 and the second connecting component 20. The damping elements 22 dampen vibrations between the connecting components 18, 20. The damping elements 22 serve for (at least partly) decoupling the control unit 14 from the internal combustion engine 10 which vibrates during operation.

Figure 3B:
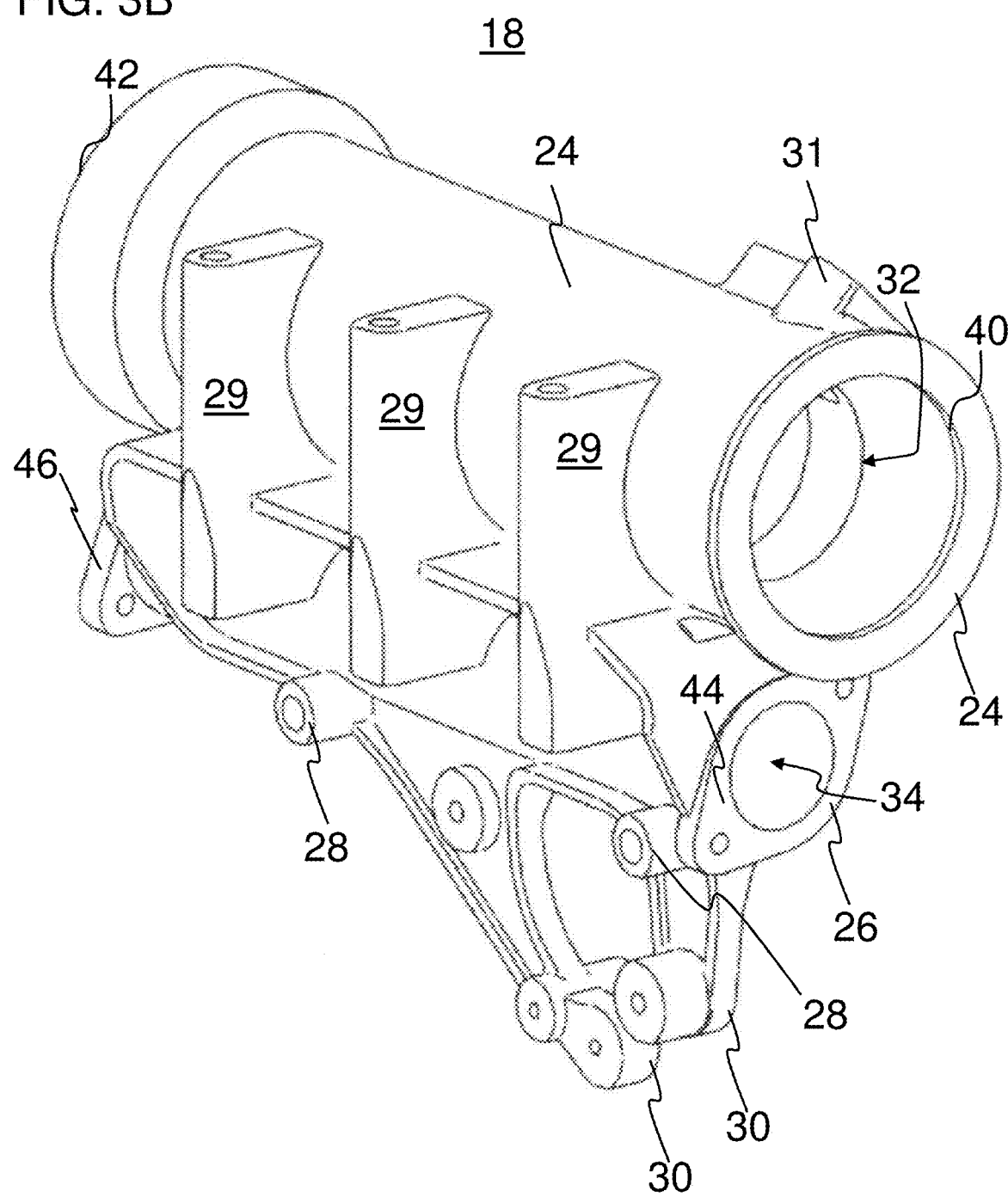
FIG. 3B shows a perspective rear view of the first connecting component.
Figure 4:
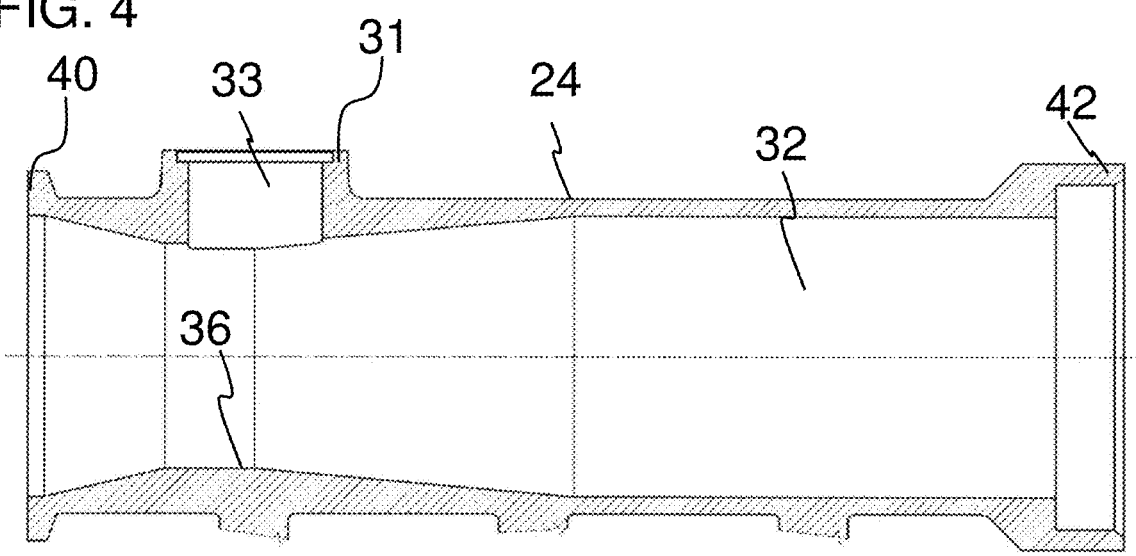
FIG. 4 shows a longitudinal sectional view through a first pipe section of the first connecting component.

In the following, the first connecting component 18 is described making reference to FIGS. 2 to 4. The first connecting component 18 comprises a first pipe section 24, a second pipe section 26, a plurality of first and second fastening regions 28 and 30 (see FIGS. 3A and 3B) and a sensor mounting 31. The first pipe section 24, the second pipe section 26 and the fastening regions 28, 30 are provided in one piece with one another as a casting. The first pipe section 24 and the second pipe section 26 are connected to one another via a plurality of stiffening ribs 29.

A first fluid duct 32 extends through the first pipe section 24 between a first inlet 40 and a first outlet 42. A second fluid duct 34 extends through the second pipe section 26 between a second inlet 44 and a second outlet 46. The first fluid duct 32 and/or the second fluid duct 34 can comprise a plurality of inlets and/or outlets and also be configured in multiple passages. The inlets 40, 44 and the outlets 42, 46 can be formed as flanges for connection to lines of the internal combustion engine 10 (for example an intake air line 50, an exhaust gas recirculation line 52, cf. FIG. 1). The first outlet 42 of the first pipe section 24 is designed so that a throttle valve device 48 can be attached to the first outlet 42 (cf. FIG. 1). The flanges can generally be embodied so that further components, that are needed for the function of the internal combustion engine 10, can be directly attached. Accordingly, substantial freedoms in the mounting and dismounting of components in the event of a service materialize.

The first fluid duct 32 and the second fluid duct 34 substantially extend in a straight line and parallel to one another. The first fluid duct 32 and the first pipe section 24 form a section of the charge air line 50 (see FIG. 1) of an intake air system of the internal combustion engine 10. The second fluid duct 34 and the second pipe section 26 form a section of the exhaust gas recirculation line 52 (see FIG. 1) of the internal combustion engine 10. The pipe sections 24, 26 are integrated in the lines 50, 52 for example via suitable clamps and flanges, i.e. as line sections connected to other line sections of the lines 50, 52. The first fluid duct 32 and the second fluid duct 34 can have different flow cross sections which are adapted to the respective function. The flow cross section of the first fluid duct 32 used as intake air duct is greater than the flow cross section of the second fluid duct 34 used as exhaust gas recirculation duct.

The first fastening regions 28 are designed in order to fasten the first connecting component 18 to the cylinder head 16 (see FIG. 1). The first fastening regions 28 can be provided for example as through-holes, into which screws or the like can be inserted. The screws fasten the first connecting component 18 to the cylinder head 16. In the shown embodiment, two first fastening regions 28 are provided. In other embodiments, more or fewer first fastening regions 28 can be provided.

The second fastening regions 30 are designed in order to fasten the damping elements 22 to the first connecting component 18 so that the second connecting component 20 can be attached via the damping elements 22 (see FIG. 2) to the first connecting component 18. For this purpose, a screw or the like can be screwed for example from the second connecting component 20 through a through-hole in the damping element 22 into an aperture in the second fastening region 30. As is evident in particular from FIG. 3A, the shown embodiment comprises five second fastening regions 30 which are spaced from one another. The second fastening regions 30 are positioned so that the vibration from the first connecting component 18 to the second connecting component 20 is dampened as favourably as possible by providing the damping elements 22 on the second fastening regions 30. Expressed in other words, the second fastening regions 30 and the damping elements 22 are arranged in particular in positions with vibration maximums during operation of the internal combustion engine 10. For example, two second fastening regions 30 are positioned between the first pipe section 24 and the second pipe section 26 (see FIG. 3A). Three further fastening regions 30 are positioned in the installed state below the second pipe section 26. Thus, the fastening screws are arranged in a manner easily accessible for screwing tools.

The first and second fastening regions 28 and 30 are arranged and designed so that the duct courses of the first fluid duct 32 and of the second fluid duct 34 are not negatively affected or only to the lowest degree possible (this applies in particular to the flow duct 32). Thus, a flow-favourable, smooth-walled (flat-walled) line routing in particular of the first fluid duct 32 without constricting screw mountings or the like can be made possible. This means that the first fluid duct 32 is not subject to any change of the flow cross section by providing the first and second fastening regions 28 and 30.

The sensor mounting 31 is arranged on the first pipe section 24. The sensor mounting 31 comprises a sensor duct 33 which leads into the first fluid duct 32 (cf. FIG. 4). A sensor 38 (cf. FIG. 1) can be fastened to the sensor mounting 31. The sensor 38 can be introduced through the sensor duct 33 so that it at least partly projects into the first fluid duct 32.

The sensor 38 can for example be a pressure sensor, a temperature sensor or a flow rate sensor. An inner circumferential surface of the first fluid duct 32 can comprise a venturi pipe section 36 (defined constriction of the flow cross section of the first fluid duct 32). In the shown embodiment, the venturi pipe section 36 makes it possible, for a liquid or gaseous medium flowing through the first fluid duct 32, for the dynamic pressure (stagnation pressure) at the narrowest point of the first fluid duct 32 to become maximal and the static pressure to become minimal. Accordingly, taking into account for example a measured media temperature and the known cross-sectional area in the narrowest cross section of the venturi pipe section 36, the media quantity flowing through can be calculated. The narrowest cross-sectional area can be produced in particular by mechanical working, so that the actual size of the same corresponds as accurately as possible to the desired size utilized for the calculation. The narrowest cross-sectional area however can also be realized with sufficient accuracy by a casting process. Generally, the first fluid duct 32 can thus be adapted to a measurement principle or a measurement requirement of the sensor 38. In other embodiments, more or fewer sensors with suitable sensor mountings and, if required, adapted geometries of the first or second fluid duct 32, 34 can be provided on the first and/or the second pipe section 24, 26.

In the following, the second connecting component 20 is described making reference to FIGS. 1 and 2. The second connecting component 20 is (solely) connected (in a dampened manner) to the first connecting component 18 via the damping elements 22. The control unit 14 is mounted on the second connecting component 20, for example screwed to the same. The second connecting component 20 is attached to the first connecting component 18 on the outside. The control unit 14 and the second connecting component 20 are arranged outside the first fluid duct 32 and the second fluid duct 34. The second connecting component 20 carries the control unit 14.

The present disclosure is not restricted to the exemplary embodiments described above. A plurality of versions and modifications are possible which likewise utilize the concepts disclosed herein are therefore considered within the scope of the present disclosure.

LIST OF REFERENCE NUMBERS

10 Internal combustion engine
12 Connecting device
14 Control unit
16 Crankcase
18 First connecting component
20 Second connecting component
22 Damping element
24 First pipe section
26 Second pipe section
28 First fastening region
29 Stiffening rib
30 Second fastening region
31 Sensor mounting
32 First fluid duct
33 Sensor duct
34 Second fluid duct
36 Venturi pipe section
38 Sensor
40 First inlet
42 First outlet
44 Second inlet
46 Second outlet
48 Throttle valve device
50 Intake air line
52 Exhaust gas recirculation line

The invention claimed is:

1. A device for attaching a control unit to a component of an internal combustion engine, comprising:
   a first connecting component which is designed in order to be attached to the component of the internal combustion engine, wherein the component is formed as a crankcase, a cylinder head or a cylinder head cover the first connecting component comprising a first fluid duct, and
   a second connecting component, which, via at least one damping element, is attached, spaced from the first fluid duct, to the first connecting component and is designed for the mounting of the control unit.

2. An internal combustion engine for a motor vehicle, comprising:
   a control unit;
   a first connecting component which is designed in order to be attached to a component of the internal combustion engine, wherein the component is formed as a crankcase, a cylinder head or a cylinder head cover, and the first connecting component comprising a first fluid duct, and
   a second connecting component, which, via at least one damping element, is attached, spaced from the first fluid duct, to the first connecting component and is designed for the mounting of the control unit, wherein the first fluid duct or a second fluid duct forms a section of an intake air line of the internal combustion engine, a section of an exhaust line of the internal combustion engine, a section of an exhaust gas recirculation line of the internal combustion engine, a section of a compressed-air line of the internal combustion engine, a section of a hydraulic line of the internal combustion engine, a section of an oil line of the internal combustion engine, a section of a fuel line of the internal combustion engine or a section of a coolant line of the internal combustion engine.

3. The internal combustion engine according to claim 2, wherein at least one fastening region is arranged between the first fluid duct and the second fluid duct and is designed for fastening one of the at least one damping element or of the first connecting component to the component of the internal combustion engine.

4. The internal combustion engine according to claim 2, wherein a first pipe section with the first fluid duct and a second pipe section with the second fluid duct are connected to one another by at least one stiffening rib.

5. The internal combustion engine according to claim 2, wherein a first pipe section with the first fluid duct and a second pipe section with the second fluid duct are connected to one another by at least one stiffening rib.

6. The internal combustion engine according to claim 2, wherein the first connecting component comprises at least one fastening region for fastening the at least one damping element, a first pipe section with the first fluid duct or a second pipe section with the second fluid duct, the first pipe section, the second pipe section or the at least one fastening region being formed integrally with one another, or the first connecting component being a casting.

7. The internal combustion engine according to claim 2, wherein the first connecting component furthermore comprises at least one sensor mounting for receiving a sensor, which leads in particular into the first fluid duct or into a second fluid duct of the first connecting component.

8. The internal combustion engine according to claim 2, wherein the first fluid duct or the second fluid duct comprises a venturi pipe section and the at least one sensor mounting leads in particular into the venturi pipe section.

9. The internal combustion engine according to claim 2, further comprising at least one sensor, in particular a pressure sensor, a temperature sensor or a flow rate sensor, the at least one sensor being arranged in the at least one sensor mounting.

10. The internal combustion engine according to claim 2, further comprising at least one flow rate changing device, in particular a throttle valve or a valve, which is provided at an inlet of the first fluid duct, at an inlet of the second fluid duct, in the first fluid duct, in the second fluid duct, at an outlet of the first fluid duct or at an outlet of a second fluid duct of the first connecting component.

11. The internal combustion engine according claim 2, wherein the first fluid duct or a second fluid duct of the first connecting component comprises one or a plurality of inlets for uniting a plurality of part flows and one or a plurality of outlets for branching into a plurality of part flows.

12. The internal combustion engine according to claim 2, wherein the first fluid duct or a second fluid duct of the first connecting component is embodied in multiple passages.

13. The internal combustion engine according claim 2, wherein the at least one damping element comprises a plurality of damping elements which are arranged in positions of the first connecting component spaced from one another, wherein in the installed state of the first connecting component, the plurality of damping elements are spaced from one another in particular in a vertical direction and/or in a horizontal direction.

14. The internal combustion engine according claim 2, wherein the control unit is an electronic engine control unit of an internal combustion engine.

15. The internal combustion engine according to claim 2, wherein the first connecting component comprises a second fluid duct which is provided separately from the first fluid duct or runs substantially parallel to the first fluid duct.

16. The internal combustion engine according to claim 2, wherein the motor vehicle is a utility vehicle.

17. A motor vehicle, in particular a utility vehicle, comprising:
an internal combustion engine, including:
a control unit;
a first connecting component which is designed in order to be attached to a component of the internal combustion engine, wherein the component is formed as a crankcase, a cylinder head or a cylinder head cover, and the first connecting component comprising a first fluid duct, and
a second connecting component, which, via at least one damping element, is attached, spaced from the first fluid duct, to the first connecting component and is designed for the mounting of the control unit, wherein the first fluid duct or a second fluid duct forms a section of an intake airline of the internal combustion engine, a section of an exhaust line of the internal combustion engine, a section of an exhaust gas recirculation line of the internal combustion engine, a section of a compressed-air line of the internal combustion engine, a section of a hydraulic line of the internal combustion engine, a section of an oil line of the internal combustion engine, a section of a fuel line of the internal combustion engine or a section of a coolant line of the internal combustion engine.

* * * * *